United States Patent [19]

Nakade et al.

[11] Patent Number: 5,422,682
[45] Date of Patent: Jun. 6, 1995

[54] CONFIGURABLE CHANNEL SELECTING APPARATUS WITH CHANNEL INCREASING KEY

[75] Inventors: Tomoaki Nakade; Hitoshi Komatsu, both of Saitama, Japan

[73] Assignee: Kabushiki Kaisha Toshiba, Kanagawa, Japan

[21] Appl. No.: 92,411

[22] Filed: Jul. 16, 1993

[30] Foreign Application Priority Data

Jul. 17, 1992 [JP] Japan .................................. 4-191046
Mar. 31, 1993 [JP] Japan .................................. 5-072633

[51] Int. Cl.$^6$ .............................................. H04N 5/44
[52] U.S. Cl. .................................. 348/732; 348/734; 455/166.1; 455/186.2
[58] Field of Search .................. 348/734, 732, 731; 455/185.1, 186.1, 186.2, 166.1, 166.2, 165.1, 151.2; H04N 5/44

[56] References Cited

U.S. PATENT DOCUMENTS

| | | | |
|---|---|---|---|
| 4,495,654 | 1/1985 | Deiss | 455/166.1 |
| 4,525,866 | 6/1985 | Templin | 455/186.2 |
| 4,737,993 | 4/1988 | DeVilbiss | 348/731 |
| 4,881,273 | 11/1989 | Koyama et al. | 455/166.2 |
| 4,888,819 | 12/1989 | Oda et al. | 348/731 |
| 5,161,023 | 11/1992 | Keenan | 455/185.1 |
| 5,193,005 | 3/1993 | Tomita | 348/732 |

FOREIGN PATENT DOCUMENTS 0477756  1/1992  European Pat. Off. ........ H04N 5/44

OTHER PUBLICATIONS

Yasuda, H., MPEG1, Published International Standard of Coding for Multi-Media, pp. 126–156 (No translation of this document is readily available) Jul. 1990.
Patent Abstracts of Japan, vol. 15, No. 209, 28 May 1991, JPA 03 058 519.

Primary Examiner—James J. Groody
Assistant Examiner—Jeffrey S. Murrell
Attorney, Agent, or Firm—Cushman, Darby & Cushman

[57] ABSTRACT

A channel selecting apparatus includes a broadcast signal selector provided with a plurality of channels corresponding to respective broadcast stations for selecting a channel among the plurality of channels, channel selecting keys for directly selecting one channel among regular channels, a channel increasing key for establishing at least one auxiliary channel other than the regular channels, a channel shift key for selecting one of the regular channels while sequentially shifting a current channel among the regular channels and the auxiliary channels for generating instructions corresponding to respective keys whenever the channel selecting key, the channel increasing key and the channel shift key are operated, a storage device for storing a plurality of regular channel data corresponding to the respective regular channel auxiliary channel data other than the regular channel data, and a controller for defining storage areas and for controlling the channel shift operation by the channel selector while referring to the regular channel data and the auxiliary channel data based on the operating instruction.

6 Claims, 6 Drawing Sheets

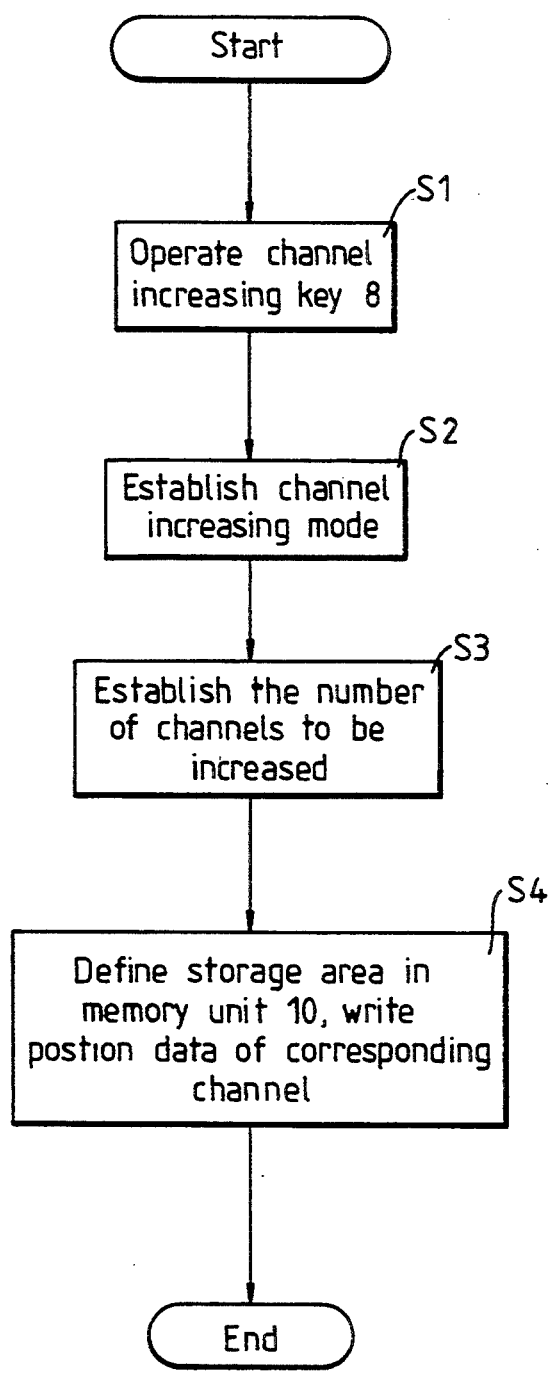

CONFIGURABLE CHANNEL SELECTING APPARATUS WITH CHANNEL INCREASING KEY

FIELD OF THE INVENTION

The present invention relates generally to a television receiver, and more particularly, to a channel selecting apparatus of the television receiver for selecting received broadcast signals associated with a prescribed broadcast station among those received through an antenna from a plurality of broadcast stations.

BACKGROUND OF THE INVENTION

Conventionally television receivers are provided with a channel selecting apparatus for selecting broadcast signals received from a prescribed broadcast station from those received through an antenna from a plurality of broadcast stations. Some of the channel selecting apparatus have a plurality of regular channels associated with respective broadcast stations and are equipped with a selector for selecting received broadcast signals from a corresponding prescribed broadcast station by selecting one regular channels, an instruction key for generating an operating instruction to the selector by operating the instruction key, a storage device for storing a plurality of regular channel data associated with the respective regular channels, and a controller for controlling the operation of the selector by reading the regular channel data of the storage device based on the operating instruction from the instruction key and referring to this regular channel data.

The instruction key has a remote controller. This remote controller is provided with twelve channel selection keys, a channel shift-up key and a channel shift-down key all of which are manually controlled.

Each of the channel selection keys is assigned with a number corresponding to the regular channels. For instance, when selecting a desired channel, the channel selection key assigned the number corresponding to the desired channel is pushed. The operating instruction generated by pushing this channel selection key is given to the control means.

The channel shift-up key and the channel shift-down key are used for sequentially shifting the channels. Whenever the channel shift-up key is manually pushed, the operating instruction is given to the control means to switch the currently selected channel to a channel which is set at the upstream side as shown in FIG. 1. On the contrary, whenever the channel shift-down key is manually pushed, the operating instruction is given to the control means to switch the currently selected channel sequentially to the channels which are set at the downstream side.

In recent years, many broadcast stations have been put into operation, for instance, for satellite broadcasting, CATV and the like, and many broadcasting programs are provided. With the increase in broadcast stations, it has been demanded to make it more simple to select a desired broadcast station.

To satisfy the above requirement, it is considered necessary to provide additional channel selection keys corresponding to increased channels to a remote controller of a channel selecting apparatus. However, the increase of channel selection keys makes the size of a remote controller large. Furthermore, the operability of a remote controller can be deteriorated if the number of the channel selection keys is increased.

Instead of the channel selection keys, some remote controllers are provided with a ten-key pad for entering channel numbers. However, it is not possible to select a desired channel only by one operation and their operability is inferior to the channel selection key.

As described above on such a conventional channel selecting apparatus, if the number of channel selection keys increases in consonance with the increase of broadcast stations, a remote controller, etc. will become large in size and its operability will be deteriorated.

SUMMARY OF THE INVENTION

It is, therefore, an object of the present invention to provide a channel selecting apparatus which is capable of selecting channels to cope with a number of broadcast stations without causing a large sized key operating means and deterioration of the operability resulting from the increase in the number of channel selection keys.

Another object of the present invention is to provide a channel selecting apparatus which is capable of facilitating a desired channel selection without the possibility of selecting the same channel twice in selecting channels by sequentially shifting a current channel among a plurality of channels in the upward or downward direction, and of storing and setting more channels desired and promoting the operability of the apparatus.

In order to achieve the above objects, a channel selecting apparatus according to a first aspect of the present invention includes a broadcast signal selecting means, provided with a plurality of channels corresponding to respective broadcast stations, for selecting broadcast signals received from a prescribed broadcast station by selecting a channel among the plurality of channels, a key operating means, provided with a plurality of channel selecting keys for directly selecting one channel among regular channels which are less than the channels of the selecting means, a channel increasing key for establishing at least one auxiliary channel other than the regular channels, and a channel shift key for selecting one of the regular channels while sequentially shifting a current channel among the regular channels and the auxiliary channels, for generating operating instructions corresponding to respective keys whenever the channel selecting key, the channel increasing key and the channel shift key are operated, a storage means which has storage areas for storing a plurality of regular channel data corresponding to the respective regular channel and storage areas for storing auxiliary channel data, which differ from the regular channel data storage areas, and a control means for defining the storage area of the storing means corresponding to the auxiliary channel which is established by operating the channel inceasing key of the key operating means, for writing the auxliary channel data in the storage area when the channel increasing key of the key operating means is operated, and for controlling the channel shift operation by the channel selecting means while referring to the regular channel data and the auxiliary channel data based on the operating instruction generated by the channel shift key operation when the channel shift key of the key operating means is operated.

In order to achieve the above object, a channel selecting apparatus according to a second aspect of the present invention includes a broadcast signal receiving means for selectively receiving a desired channel among a plurality of channels including a tuner, a key input means containing a plurality of keys for a channel selection, a storage means for storing channel selection data required for receiving broadcast signals, a setting/storing means for setting and storing channel selecting data corresponding to respective channel selecting keys, a channel selection directing means for directing the sequential selection of channel selection data stored in the setting/storing means and the reception of broadcast signals, and a control means for controlling to exclusively select only one of the channel selection data if a plurality of the same channel selection data are repetitively stored in the setting/storing means.

In order to achieve the above object, the channel selecting apparatus according to the second aspect of the present invention may include means to inform of the same channel selection data as required if they are stored repetitively in the setting/storing means.

On the channel selecting apparatus according to the first aspect of the present invention, when the channel increasing key of the key operating means is operated, the storage areas of the storage means corresponding to the number of auxiliary channels which are established by the key operation are defined and the auxiliary channel data are written into the storage areas. When the channel shift key of the key operating means is pushed, the regular channel data and the auxiliary channel data of the storage means are referred to based on the operating instruction corresponding to the key operation, and the regular channels and the auxiliary channels are sequentially shifted. Thus, the channels corresponding to many broadcast stations can be selected without increasing the number of channel selection keys and the large sized key operating means and deterioration of the operability resulting from an increase in the number of channel keys can be prevented.

On the channel selecting apparatus according to the second aspect of the present invention, if a plurality of the same channel selection data are stored in the setting/storing means, that is, the same channel selection data are stored repetitively, the channel selecting apparatus according to the present invention in the construction as described above selects a channel according to one of the channel selection data. When selecting a desired channel from a plurality of stored channels sequentially in the upward or downward direction according to the direction from the selection directing means, if the same channel selection data are stored twice, the set channels are sequentially selected based on either one of the channel selection data. Furthermore, it is informed that the same channel has been stored repetitively. Therefore, the same channel will not be selected twice, a desired channel selection is facilitated and more desired channels are stored.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 4 is an explanatory diagram for explaining the channel increasing operation of the channel selecting apparatus shown in FIG. 2;

DESCRIPTION OF THE PREFERRED EMBODIMENTS

The present invention will be described in detail with reference to the FIGS. 2 through 9.

Figure 1:
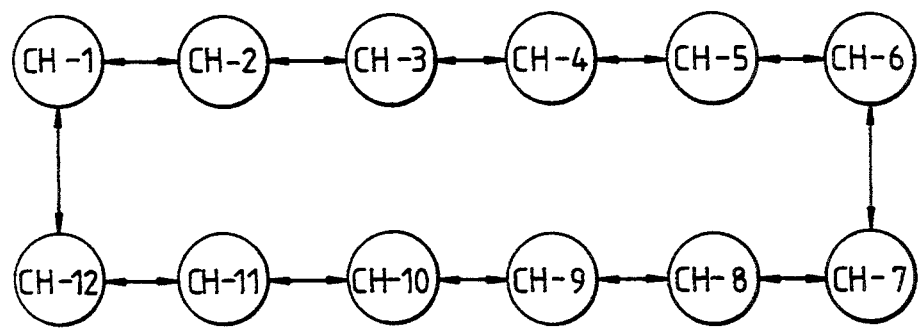
FIG. 1 is a diagram for explaining the channel shift sequence in the channel shift operation of a conventional channel selecting apparatus.
Figure 2:
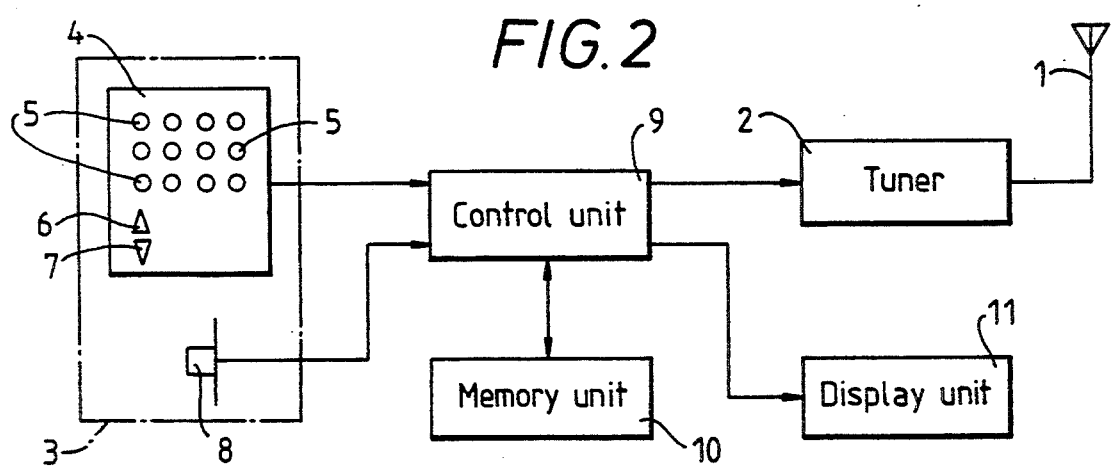
FIG. 2 is a block diagram showing a first embodiment of the channel selecting apparatus according to the present invention.
Figure 3:
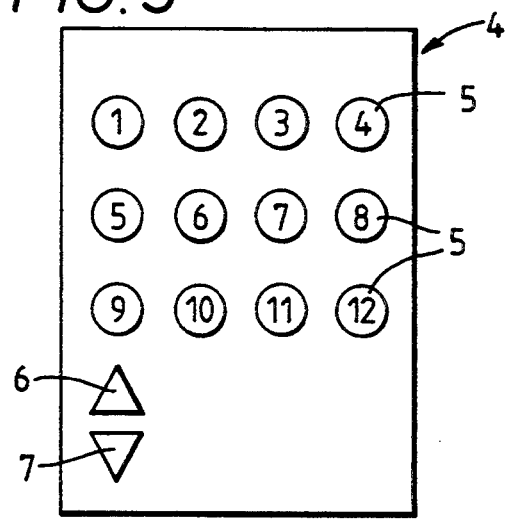
FIG. 3 is a diagram showing a remote controller which is used as a key operating means of the channel selecting apparatus shown in FIG. 2.

Referring now to FIGS. 2 through 5, a first embodiment of the channel selecting apparatus according to the present invention will be described in detail. FIG. 2 shows a block diagram of the channel selecting apparatus according to the first embodiment, while FIG. 3 shows a remote controller which is used as a key operating means of the channel selecting apparatus of FIG. 2.

Television receivers capable of receiving satellite broadcasting signals, CATV signals, etc. are provided with a channel selecting apparatus for selecting a desired broadcast signal from a plurality of broadcast signals including satellite broadcast signals.

This channel selecting apparatus has a plurality of channels corresponding to respective broadcast signals received through an antenna 1 and a tuner 2 for selecting a desired broadcast signal from the plurality of the broadcast signals by selecting a channel corresponding to the desired broadcast signal as shown in FIG. 2. The channels of the tuner 2 consist of a plurality of channels corresponding to ground wave broadcast stations, a plurality of channels corresponding to satellite broadcast stations and a plurality of channels corresponding to CATV stations. The operating instructions to the tuner 2 for the channel selecting operation are generated by operating keys on a key pad 4.

The key pad 4 is equipped on a remote controller 3. The remote controller 3 corresponds to a channel increasing key 8 which is provided on the television receiver. The remote controller 3 includes twelve channel selection keys 5, a channel shift-up key 6 and a channel shift-down key 7 which are manually operated, respectively.

Each of the channel selecting keys 5 corresponds to a predetermined channel, and is assigned with a corresponding channel number. If the channel selection key 5 with, for instance, the channel number "1" (referred as to CH-1) assigned is pushed, the operating instruction is generated for selecting the CH-1.

Whenever the channel shift-up key 6 is manually pushed, a channel selecting instruction is generated to switch the currently selected channel to a channel set up at the upstream side. On the contrary, whenever the channel shift-down key 7 is manually pushed, the instruction is generated to sequentially switch the currently selected channel to the channels set up at the downstream from the current channel.

The channel increasing key 8 is composed of an operating key to give an instruction for the channel increasing. When this key is pushed, an instruction directing the number of channels to be increased is generated. Further, this instruction means to increase at least one channel in addition to the CH-1 through the CH-12. When the channel increasing instruction is issued, the channel selection keys 5 are used as operating keys for issuing an instruction for the channel increasing.

The operating instruction and the channel increasing instruction are given to a control unit 9 from the key pad 4. The channel selection mode and the channel increasing mode have been set up for the control unit 9.

When provided with an operating instruction, the control unit 9 establishes the channel selection mode. In the channel selection mode, channel data corresponding to the operating instruction are read out of a memory 10 based on this channel data, a control signal for controlling the channel selecting operation of the tuner 2 is generated and given to the tuner 2. With the generation of this control signal, channel information to express the currently selected channel is generated and thus the channel information is applied to a display unit 11 and is displayed on the display unit 11.

On the contrary, when provided with a channel increasing instruction, the control unit 9 establishes a channel increasing mode. In the channel increasing mode, a storage area corresponding to the number of channels to be increased in a memory unit 10 is defined based on the channel increasing instruction, and corresponding auxiliary channel data are written into this storage area. When the channel increasing data are written into the storage area, information showing the number of channels to be increased and information showing the number of the auxiliary channels to be established for respective channels is generated and this information is provided to the display unit 11 and is displayed on the display unit 11.

Figure 5:
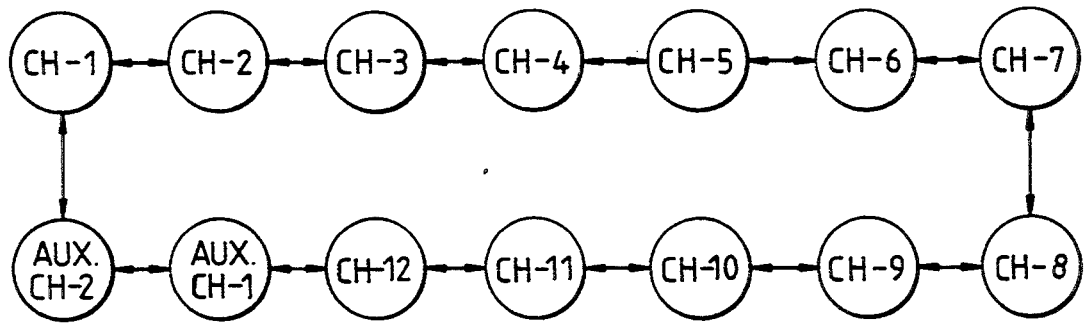
FIG. 5 is a diagram for explaining the channel shift sequence in the channel shift operation of the channel selecting apparatus shown in FIG. 2.

Now the channel increasing operation and the channel selecting operation in the channel selecting apparatus will be explained with reference to FIGS. 4 and 5. FIG. 4 shows a flowchart for explaining the channel increasing operation performed by the channel selecting apparatus of FIG. 2, while FIG. 5 shows a sequence of the channel shift operation also performed by the channel selecting apparatus of FIG. 2.

When establishing two auxiliary channels for the satellite broadcasting, the channel increasing key 8 is first operated (step S1) as shown in FIG. 4, and the channel increasing instruction is issued to the control unit 9, which in turn establishes the channel increasing mode based on the channel increasing instructino (step S2).

In the channel increasing mode, the number of channels to be increased is first established (step S3). When establishing the number of the auxiliary channels, the channel selection key 5 with the number "2" assigned is pushed and the auxiliary channel number "2" (referred to as AUX.CH-2 hereinafter) is applied to the control unit 9, the control unit 9 defines storage areas in the memory unit 10 according to the number of channels to be increased, and position data of the corresponding channels are written into the respective storage areas (step S4). That is, the position data of teh AUX.CH-1 and the AUX.CH-2 are written into the storage areas in the memory unit 10.

When the position data of the auxiliary channels are written into the storage areas, the information showing the number of channels to be increased and the information showing the numbers that are established for the auxiliary channels are generated and displayed on the display unit 11.

Then, a corresponding broadcast station is set up for each of the auxiliary channels. This set-up operation is made by operating the channel set-up keys provided on a television receiver and data required for bringing the broadcast stations and the auxiliary channels correspond to each other are set up. Tuning voltage, etc. are included in these data, which are stored in the memory unit 10 corresponding to the auxiliary channels.

Next, the channel selecting operation performed in the channel selecting apparatus as shown in FIG. 2 will be explained.

When selecting a prescribed channel from various channels including the auxiliary channels, either the channel shift-up key 6 or the channel shift-down key 7 is first pushed. When the channel shift-up key 6 is pushed, an instruction is issued for shifting a current channel to another channel locating at its upstream side. The control unit 9 reads out the position data of the channel located at the upstream side from the memory unit 10 based on the instruction and controls the tuner 2 to select the upstream channel from the position data of this channel. On the contrary, when the channel shift-down key 7 is pushed, an instruction is issued to switch the current channel to a channel located at its downstream side.

During the channel shift operation, a channel is shifted along the pre-set channel shifting path. This channel shifting path is composed of a closed loop including the regular channels CH-1 to CH-12 an then auxiliary channels AUX.CH-1 and AUX.CH-2. When selecting a desired channel, the channel selecting key 5 is first pushed and an instruction is applied to the control unit 9 to switch the current channel to a channel corresponding to the pushed channel selecting key 5. Based on this instruction, the control unit 9 reads the position data of a channel corresponding to the pushed channel selecting key 5 out of the memory unit 10 and controls the tuner 2 to select the channel corresponding to the pushed channel selecting key 5 from the position data of this channel.

Thus, it is possible to select the channels corresponding to many broadcast stations without increasing the channel selecting keys 5 and further, it is also possible to prevent a remote controller from becoming large in size and the deterioration of operability resulting from the increase in the number of channel selecting keys 5.

As described above, the channel selecting apapratus according to the first aspect of the present invention allows selection of channels corresponding to a large number of broadcast stations without making the size of a remote controller large and causing deterioration of the operability of the channel selecting apparatus resulting from the increase in the number of channel selecting keys.

Referring now to FIGS. 6 through 9, a channel selecting apparatus according to the second embodiment of the present invention will be explained in detail.

Figure 6:
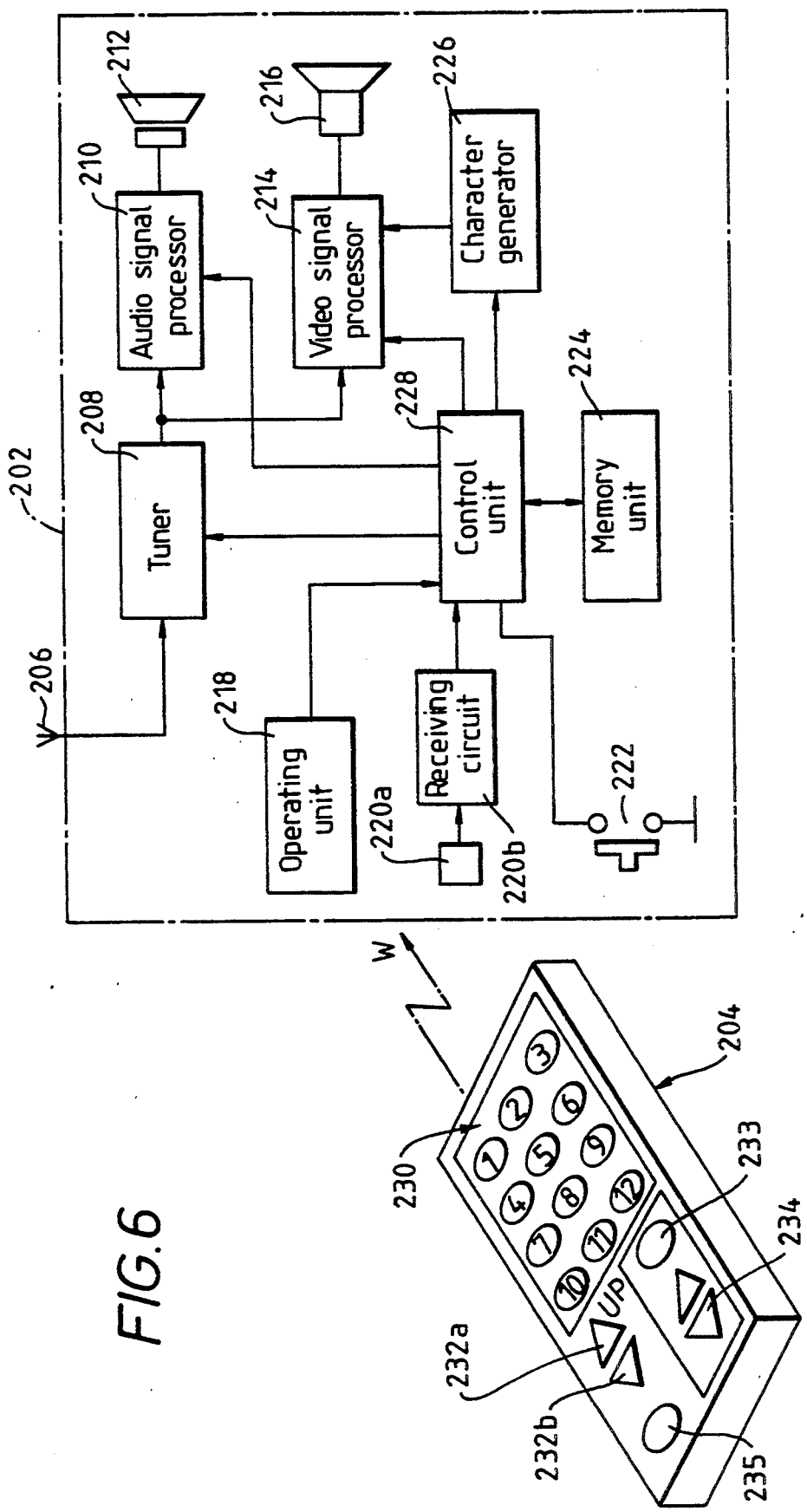
FIG. 6 is a diagram showing a second embodiment of the channel selecting apparatus according to the present invention.

In FIG. 6, the channel selecting apparatus in this second embodiment is comprised of a television receiver 202 and a remote controller 204 which remotely controls the television receiver 202.

The television receiver 202 has an antenna 206 for receiving television broadcast signals and a tuner 208 for selecting a channel for a desired signal among channels of the broadcast signals supplied from the antenna 206. If signals from the tuner 208, after being detected, are processed in an audio signal processor 210 and audio signals are supplied to a loudspeaker 212.

Further, the television receiver 202 is provided with a video signal processor 214 for processing a video detection and an amplification of IF signals from the tuner 208, a CRT 216 for displaying video signals from the video signal processor 214, an operating unit 218 provided on a control panel of the television receiver 202 for performing a selection of a desired channel, a sequential channel shift-up or shift-down, a set-up of sound volume, power ON/OFF operation, a set-up of luminance, hue, etc., a photo-receiver 220a for receiving such remote control signal W as infrared rays from the remote controller 204 and a receiving circuit 220b for demodulating the contents of direction (command) of the remote controller 204 from the received signal output from the photo-receiver 220a.

Furthermore, the television receiver 202 is provided with a channel increase directing button (switch) 222 for storing and setting channel data together with the operating unit 218, a memory unit 224 for storing channel data which are set by the operating unit 218 and the channel increase directing button 222, a character generator 226 for generating characters to be displayed on the CRT 216 through the video signal processor 214, and a control unit 228 for controlling these units.

As shown in FIG. 6, the remote controller 204 contains twelve direct channel selecting buttons (switch) 230, a channel shift-up button 232a, channel shift-down button 232b, a power switch 233, a set of volume up-/down buttons 234, and a channel increase directing button 235 for directing storing/setting desired channels by storing appropriate data in memory unit 224 together with the twelve direct channel selecting buttons 230.

Figure 7:
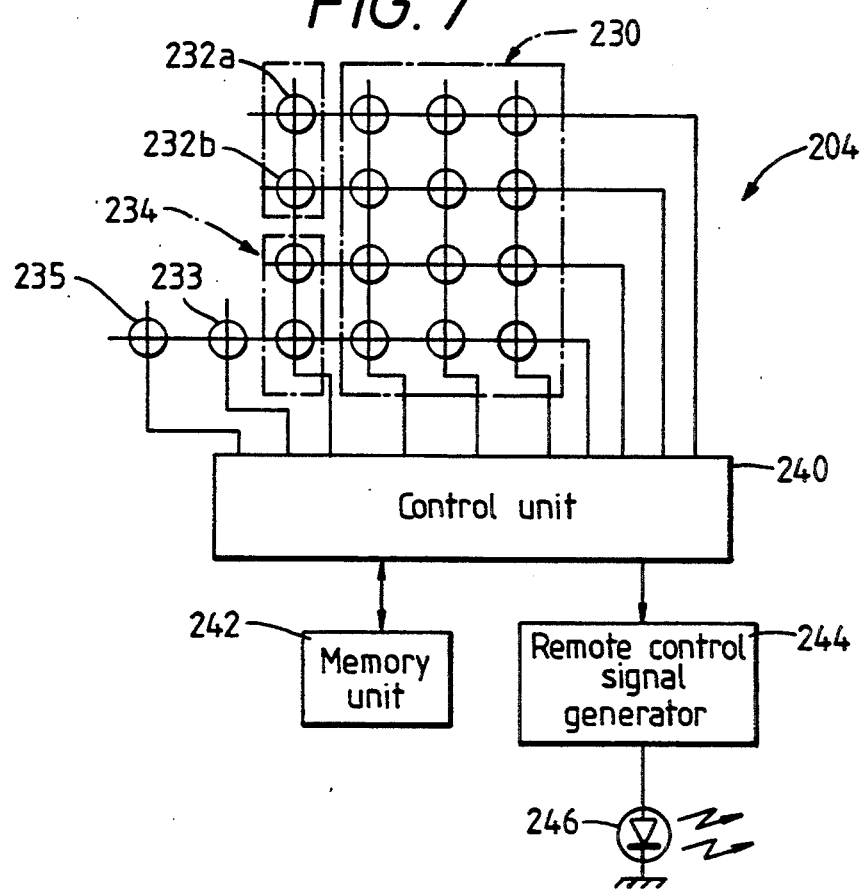
FIG. 7 is a block diagram showing the remote controller which is used as a key operating means of the channel selecting apparatus shown in FIG. 6.

FIG. 7 is a block diagram showing the electrical construction of the remote controller 204. In FIG. 7, the remote controller 204 is provided with the direct channel selecting buttons 230, the channel shift-up button 232a, the channel shift-down button 232b, the power switch 233, a control unit 240 which outputs an encoded signal identifying the pushed down positions of these buttons together with the channel increase directing button 235, and a memory unit 242 for storing channel numbers when setting desired channels for Buttons "1" through "12" of the direct channel selecting buttons 230 and the channel increase directing button 235.

Further, the remote controller 204 is also provided with a remote control signal generator 244 which outputs an encoded signal (command) from the control unit 240 modulated to infrared rays etc., and a light emitting element 246 for sending a remote control signal W. In addition, a timer ON/OFF button, a channel number display button, an audio output stop button, a channel storing/setting button, etc., may be provided when they are required.

Now the operation of the channel selecting apparatus constructed as in the embodiment will be explained.

Figure 8:
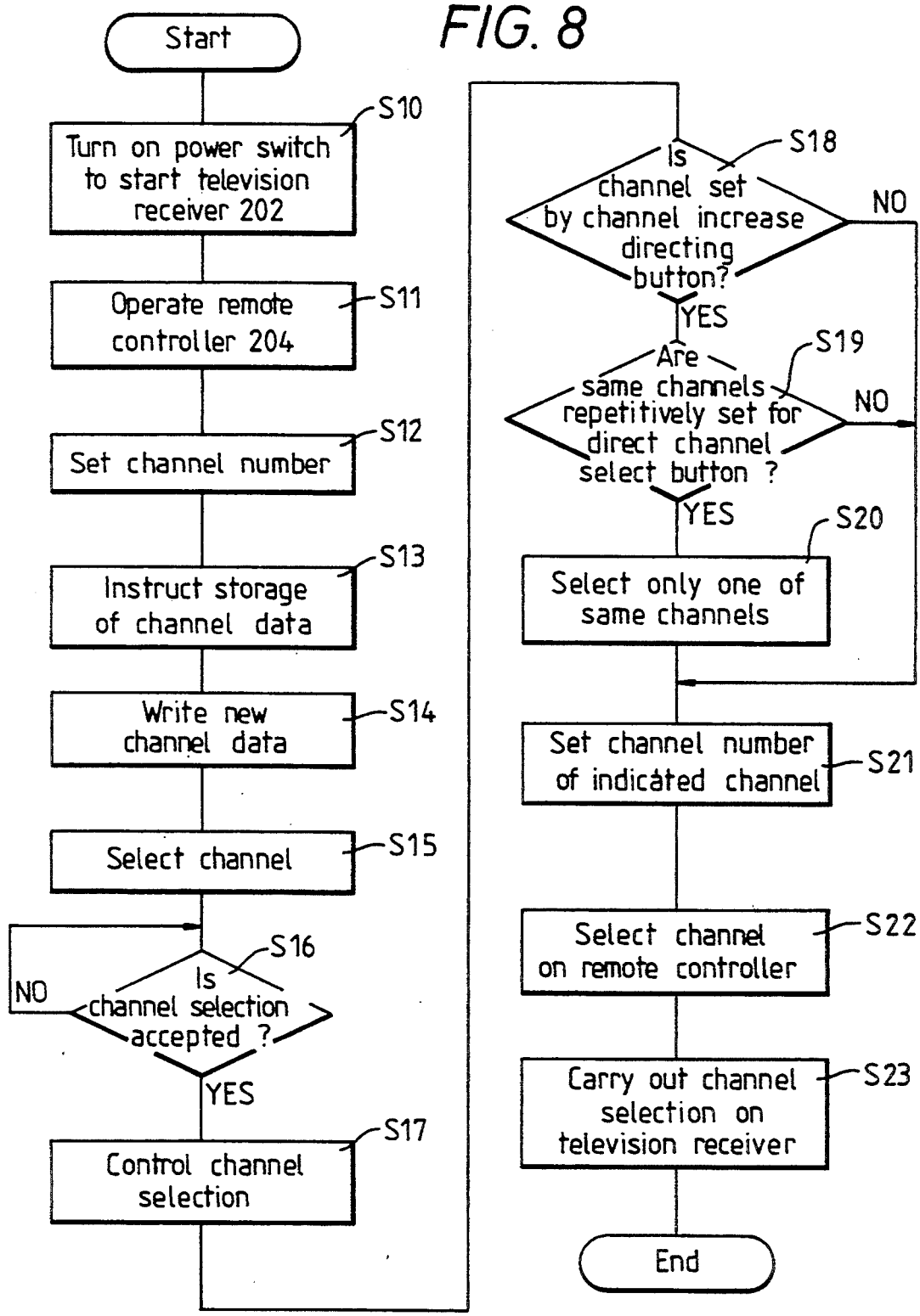
FIG. 8 is a flowchart showing the operating procedures of the channel selecting apparatus shown in FIG. 6.

FIG. 8 is a flowchart showing the operating procedures of the channel selecting apparatus in the construction as described above. The units of the television receiver 202 shown in FIG. 5 start to operate (step S10) when a viewer turns ON the power switch 233. That is, the tuner 208 selects a prescribed channel and a sound is output from the loudspeaker 212 and a video is displayed on the CRT 216.

Thereafter, a viewer operates the remote controller 204 and a channel number of a television broadcast station desired by a viewer is set for Buttons "1" through "12" of the direct channel selecting buttons 230 and the channel increase directing button 235 of the remote controller 204 (steps S11, S12). In this case, an instruction for storing a new desired channel number is sent from a storing direction button (not shown) (step S13). Now, it is assumed that the desired channel number, that is, the CH-13 of the UHF band is set for Button "12" of the direct channel selecting buttons 230 and similarly, the CH-13 is set for the channel increase directing button 235. The control unit 240 shown in FIG. 7 recognizes this setting, and erasing the previously stored channel number, writes a new channel number (step S14).

Now the channel selection made by the remote controller 204 for the television receiver 202 will be explained. The channels which are set for the direct channel selection buttons 230 and the channel increase directing button 235 are selected by pushing the channel shift-up button 232a or the channel shift-down button 232b continuously or repeatedly (step S15). Then, the control unit 240 judges whether the channel selection has been carried out (step S16). In case of "Yes", where the channel selection was made, the operation proceeds to the next step. In the case of "No", where no channel selection was made in step S16, this judgment is repeated, that is, the channel selecting apparatus is put in the channel selection waiting state.

Figure 9:
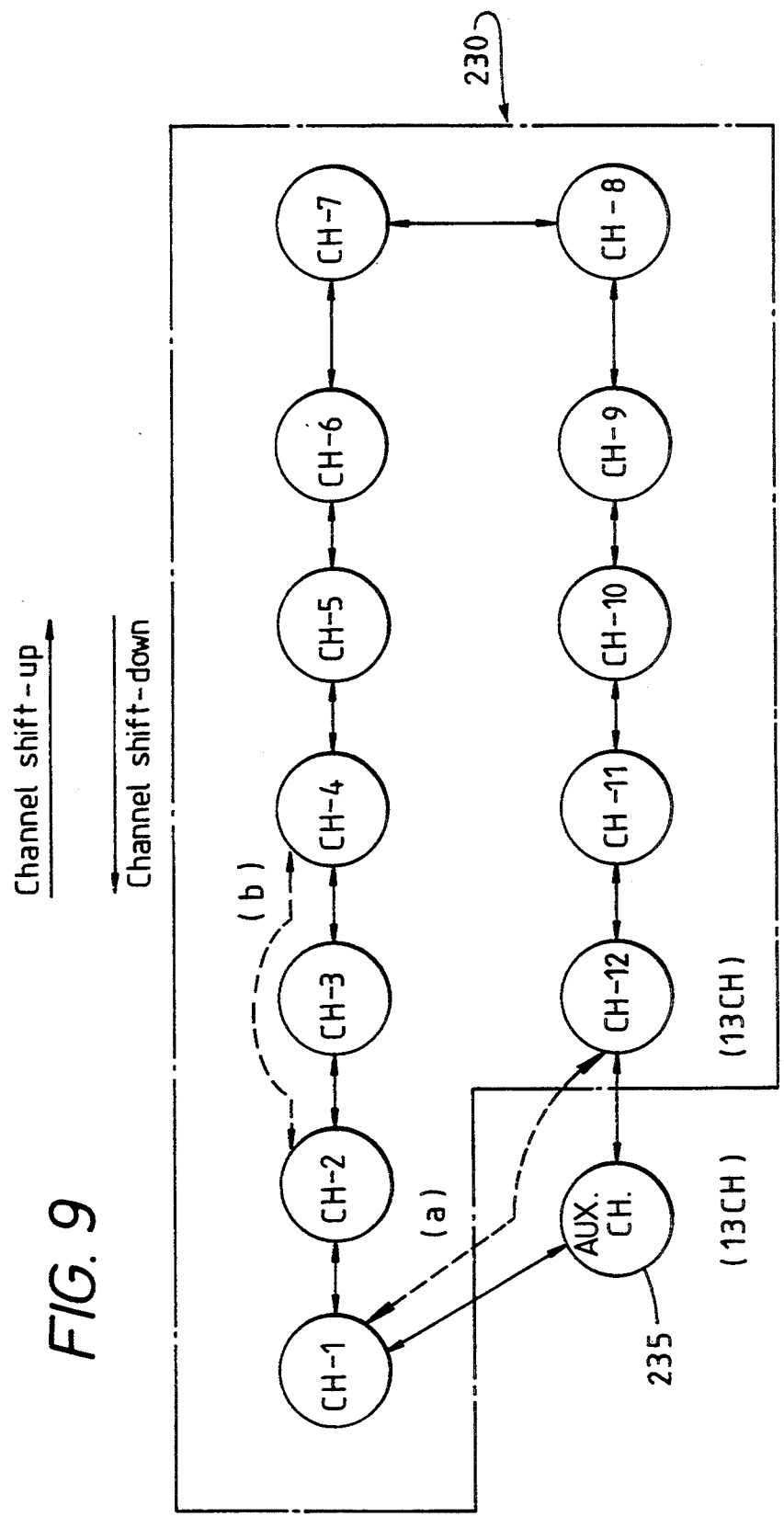
FIG. 9 is a diagram for explaining the channel shift sequence in the channel shift operation of the channel selecting apparatus shown in FIG. 6.

FIG. 9 is a diagram showing the state of this channel selection. In FIG. 9, the control unit 240 shown in FIG. 7 controls the channel selection so that the CH-1 through the CH-12 which have been set for Buttons "1" through "12" of the direct channel selection buttons 230 as well as the channel increase directing button 235 are sequentially selected in the upward direction when the channel shift-up button 232a is depressed continuously or repeatedly. Similarly, the control unit 240 controls the channel selection so that the CH-1 through the CH-12 which have been set for individual buttons "1" through "1" of the direct channel selection buttons 230 as well as the channel increase directing button 235 are sequentially selected in the downward direction when the channel shift-down button 232b is depressed continuously or repeatedly (step S17).

Then, the channel storing/setting operation carried out by the channel increase directing button 235 is judged. That is, the control unit 240 shown in FIG. 7 retrieves channel data stored in the memory unit 242 and judges whether there is a channel which has been set for the channel increase directing button 235 (step S18). Here, the CH-13 of the UHF band has been set. In succession, it is judged whether the same channel CH-13 as the channel increase directing button 235 has been set for Buttons "1" through "12" of the direct channel selection buttons 230 (step S19).

If no channel number was set for the channel increase directing button 235 in step S18, the operation proceeds to step S21 and the desired channel number setting process is carried out. Further, if the CH-13 of the UHF band has been set for Buttons "1" through "12" of the direct channel selection buttons 230, the control unit 240 shown in FIG. 7 selects either one of Button "12" for which the CH-13 of the same UHF band has been set or the channel increase directing button 235.

That is, the process is carried out as shown by the dotted line a in FIG. 9 so that the channel increase directing button 235 is not selected. Further, if the same channel number has been set in Buttons "1" through "12" of the direct channel selection buttons 230, for instance, if the same channel number has been set for Buttons "3" and "6", the process as shown by the dotted line b in FIG. 9 is carried out so that Button "3" is not selected (step S20).

Thereafter, a viewer stops the issue of the direction by the channel shift-up button 232a and the channel shift-down button 232b. The selection of a desired channel number at the position where this cycle channel selection was stopped or at the position where the intermittent depressing of the buttons was stopped is controlled by the control unit 240 shown in FIG. 7 (step S21). In succession, a code of the set channel number is output from the control unit 240 to the remote control signal generator 244 and the remote control signal W is sent out through the light emitting element 246 (step S22).

This remote control signal W is received by the photo-receiver 220a and an encoded signal is demodulated therefrom in the receiving circuit 220b and output to a control unit 228. The control unit 228 outputs this encoded signal of the character generator 226, from where a character of the channel number corresponding to the encoded signal is displayed on the CRT 216 through the video signal processor 214. The same procedures are also applicable to a case where the channel shift-down button 232b is depressed continuously or repeatedly. At the same time, in the television receiver 202, the channel selection is carried out while the control unit 228 controls the tuner 208 based on the encoded signal (step S23).

As described above, if the same channel number has been set for Buttons "1" through "12" of the direct channel selection buttons 230 and the channel increase directing button 235, because either one of the repetitively set channel numbers is selected, the same channel number will never be selected twice during the channel selection cycle by the channel shift-up button 232a and the channel shift-down button 232b. Therefore, the channels can be selected easily, and many more desired channels can be set. Thus, the operability is improved without causing cost increases.

Further, although the operating procedures shown in FIG. 8 have been explained using the remote controller 204 in this embodiment, if the operating unit 218 and the channel increase directing button 222 of the television receiver 202 are used, this channel selecting apparatus operates in the same manner and the same operating effect is obtained. Further, this embodiment is also applicable to the combination of a video tape recorder (VTR) with a BS tuner provided and the remote controller 204 instead of the combination of the television receiver 202 and the remote controller 204. Furthermore, when a FM receiver is combined with the operating unit of the main body of the apparatus or the remote controller 204, the channel selection is carried out in the same manner and the same operating effect is obtained.

Further, it is possible to inform a user of the repetitive setting of the same channel number by an LED under the control of the control unit 240 if the same channel number has been set for Buttons "1" through "12" of the direct channel selection buttons 230 and the channel increase directing button 235. In this case, a viewer is able to know the repetitive setting of the same channel number rapidly. Similarly, on the television receiver 202, it is possible to inform a user of the repetitive setting of the same channel number if so set by displaying it on the CRT 216 through the character generator 226 and the video signal processor 214.

In addition, if it would be tried to repetitively set the same channel number by the direct channel selection buttons 230, such an attempt is inhibited by inhibiting means.

That is, when prescribed channel selection data are set/stored after they are set/stored in a memory unit, it is possible to prevent the repetitive setting of those data by retrieving whether those channel data have been already stored and, if so, by inhibiting the new storage of the data.

Further, it will be more effective if a viewer is notified a reason for why channel data cannot be newly stored using the means for informing as described above.

As clearly seen from the explanation above, if at least two of the same channel numbers have been set for the channel selection buttons and the channel increasing button, and the channel selection at the tuner is directed from the channel selection directing means, the channel selecting apparatus according to the present invention selects only one of the same channel numbers which have been set twice and sequentially selects a plurality of channel numbers in the upward or downward direction. Further, as a viewer is informed of the repetitive storage of the same channel number, a desired channel selection is facilitated and many more desired channel numbers can be stored/set and the operability is thus improved.

As described above, the present invention can provide an extremely preferable channel selecting apparatus.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A channel selecting apparatus for selecting a prescribed broadcast signal from a plurality of broadcast signals received, comprising:
　　selecting means provided with a plurality of channels associated with prescribed broadcast stations, for selecting a broadcast signal from a prescribed broadcast station by selecting a prescribed one of the plurality of channels;

key operating means provided with a plurality of channel selecting keys for directly selecting one of a plurality of regular channels, a channel increasing key for establishing at least one auxiliary channel in addition to the regular channels, and a channel shift key for causing a channel to be selected by sequentially shifting among the regular channels and the established at least one auxiliary channel, the key operating means for generating operating instructions associated with respective keys whenever the channel selecting key, the channel increasing key and the channel shift key are operating;

storage means having regular channel data storage areas for storing a plurality of regular channel data associated with the regular channels, and auxiliary channel data storage areas for storing auxiliary channel data, wherein the auxliary channel data storage areas differ from the regular channel data storage areas; and control means for defining the auxiliary channel data storage areas in the storage means upon operation of the channel increasing key, for writing the auxiliary channel data in an auxiliary channel data storage area when the channel increasing key is operated, and for controlling a channel shift operation instructed by the key operating means while referring to the regular channel data and the auxiliary channel data based on the operating instruction generated by operation of the channel shift key.

2. A channel selecting apparatus for selectively receiving broadcast signals of a desired channel among those broadcast signals received from a plurality of channels, comprising:

broadcast signal receiving means for selectively receiving the broadcast signals of the desired channel among those broadcast signals received from a plurality of channels in response to channel selection data;

key operating means having a plurality of channel selecting keys for selecting the channel selection data;

storage means for storing the channel selection data required for receiving broadcast signals of the desired channel;

setting means for enabling the channel selection data corresponding to respective one of the channel selecting keys to be stored in the storage means; and control means for selecting only one of the channel selection data without selecting other same channel selection data if a plurality of the same channel selection data are stored in the storage means when selecting channel selection data from the storage means according to the key operating means.

3. A channel selecting apparatus claimed in claim 2, wherein the plurality of keys includes first keys with preset numbers and second keys for storing more channel selection data in the storage means than the number of keys in the first keys.

4. A channel selecting apparatus claimed in claim 2, wherein the key operating means includes a channel shift-up key and a channel shift-down key, the shift-up and shift-down keys for sequentially selecting broadcast signals of a plurality of channels.

5. A channel selecting apparatus for selectively receiving broadcast signals of a desired channel among those broadcast signals of a plurality of channels, comprising:

broadcast signal receiving means for selectively receiving the broadcast signals of the desired channel among those broadcast signals of the plurality of channels in response to channel selection data;

key operating means having a plurality of channel selecting keys for channel selection;

storage means for storing the channel selection data required for receiving broadcast signals of the desired channel;

setting means for enabling the channel selection data of respective channels corresponding to respective channel selecting keys to be stored in the storage means;

channel directing means for directing sequential selection of channel selection data stored in the storage means and reception of the broadcast signals of the desired channel;

control means for selecting only one of the channel selection data without selecting other same channel selection data if a plurality of the same channel selecting data are stored in the storage means when selecting channel selection data from the storage means according to the direction from the channel directing means; and means for informing when a plurality of the same channel selection data are stored in the storage means.

6. A channel selecting apparatus for selectively receiving broadcast signals of a desired channel among broadcast signals of a plurality of channels, comprising:

broadcast signal receiving means for selectively receiving the broadcast signals of the desired channel among broadcast signals of a plurality of channels in response to channel selection data;

key operating means having a plurality of channel selecting keys for selecting one of the plurality of channels;

storage means for storing the channel selection data required for receiving broadcast signals of the desired channel;

setting means for enabling the channel selection data corresponding to respective one of the channel selecting keys to be stored in the storage means;

means for inhibiting the storage of channel selection data in the storage means if the same channel selection data have been already stored when storing a prescribed channel selection data in the storage means; and channel directing means for directing sequential selection of channel selection data stored in the storage means and reception of broadcast signals of the desired channel.

* * * * *